United States Patent
Seltmann et al.

(10) Patent No.: US 8,605,250 B2
(45) Date of Patent: Dec. 10, 2013

(54) METHOD AND SYSTEM FOR DETECTING PARTICLE CONTAMINATION IN AN IMMERSION LITHOGRAPHY TOOL

(75) Inventors: Rolf Seltmann, Dresden (DE); Rene Wirtz, Stuttgart (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 672 days.

(21) Appl. No.: 12/732,751

(22) Filed: Mar. 26, 2010

(65) Prior Publication Data
US 2010/0245790 A1 Sep. 30, 2010

(30) Foreign Application Priority Data
Mar. 31, 2009 (DE) .......................... 10 2009 015 717

(51) Int. Cl.
*G03B 27/42* (2006.01)
(52) U.S. Cl.
USPC ..................... 355/53; 355/30; 355/73; 355/77
(58) Field of Classification Search
USPC ............ 355/30, 53, 72, 77; 356/237.5, 237.1, 356/239.2, 239.7, 239.8, 237.2; 430/8, 30, 430/311; 250/792.1, 492.2, 492.22
See application file for complete search history.

(56) References Cited

U.S. PATENT DOCUMENTS

| 4,468,120 A * | 8/1984 | Tanimoto et al. | .......... 356/239.8 |
| 8,059,257 B2 * | 11/2011 | Kamono | .......... 355/30 |
| 2006/0077367 A1 * | 4/2006 | Kobayashi et al. | ............. 355/53 |
| 2008/0074634 A1 * | 3/2008 | Binnard | .......... 355/73 |
| 2008/0309892 A1 | 12/2008 | Chen et al. | ....... 355/30 |

OTHER PUBLICATIONS

Translation of Official Communication from German Patent Office for German Patent Application No. 10 2009 015 717.4 dated Nov. 25, 2009.

* cited by examiner

*Primary Examiner* — Steven H Whitesell Gordon
*Assistant Examiner* — Mesfin T Asfaw
(74) *Attorney, Agent, or Firm* — Williams, Morgan & Amerson, P.C.

(57) ABSTRACT

In an immersion lithography tool, the status of the immersion hood surface may be estimated on the basis of an inline detection system that generates optical measurement data. For example, a digital imaging system may be implemented in order to obtain optical measurement data without requiring exposure of the interior of the lithography tool to ambient air. In other cases, other optical measurement techniques, such as FTIR and the like, may be applied.

21 Claims, 3 Drawing Sheets

METHOD AND SYSTEM FOR DETECTING PARTICLE CONTAMINATION IN AN IMMERSION LITHOGRAPHY TOOL

BACKGROUND OF THE INVENTION

1. Field of the Invention

The present disclosure relates to the field of fabricating microstructures, such as integrated circuits, and, more particularly, to immersion lithography processes and tools.

2. Description of the Related Art

The fabrication of microstructures, such as integrated circuits, requires tiny regions of precisely controlled size to be formed in a material layer of an appropriate substrate, such as a silicon substrate, a silicon-on-insulator (SOI) substrate or other suitable carrier materials. These tiny regions of precisely controlled size are generated by patterning the material layer by performing lithography, etch, implantation, deposition, oxidation processes and the like, wherein, typically, at least in a certain stage of the patterning process, a mask layer may be formed over the material layer to be treated to define these tiny regions. Generally, a mask layer may consist of or may be formed by means of a layer of photoresist that is patterned by a lithographic process, typically a photolithography process. During the photolithography process, the resist may be spin-coated onto the substrate surface and then selectively exposed to ultraviolet radiation through a corresponding lithography mask, such as a reticle, thereby imaging the reticle pattern into resist layer to form a latent image therein. After developing the photoresist, depending on the type of resist, positive resist or negative resist, the exposed portions or the non-exposed portions are removed to form the required pattern in the layer of photoresist. Based on this resist pattern, actual device patterns may be formed by further manufacturing processes, such as etch, implantation, anneal processes and the like. Since the dimensions of the patterns in sophisticated integrated microstructure devices are steadily decreasing, the equipment used for patterning device features have to meet very stringent requirements with regard to resolution and overlay accuracy of the involved fabrication processes. In this respect, resolution is considered as a measure for specifying the consistent ability to print minimum size images under conditions of predefined manufacturing variations. One important factor in improving the resolution is the lithographic process, in which patterns contained in the photo mask or reticle are optically transferred to the substrate via an optical imaging system. Therefore, great efforts are made to steadily improve optical properties of the lithographic system, such as numerical aperture, depth of focus and wavelength of the light source used.

Due to the ongoing demand for reducing the features sizes of microstructure devices in order to increase the density of the individual elements, the resolution capability of lithography systems has been continuously increased since the resolution of a lithography system is limited by the wavelength of the exposure radiation and the numerical aperture. Accordingly, the wavelength of the exposure radiation has been continuously reduced in an attempt to further increase the resolution capability of sophisticated lithography systems. Consequently, highly complex optical systems including refractory and/or reflecting optical components have been developed for appropriate radiation wavelength, for instance of 193 nm and less. Since the numerical aperture of an imaging system depends on the index of refraction of a medium provided between the last optical components of the imaging system and the surface to be exposed, recently, immersion lithography systems have been proposed in which the exposure light is not transmitted through air or vacuum from the imaging system to the surface to be exposed, but rather an immersion lithography medium may be provided having a significantly higher index of refraction. For example, an appropriate immersion medium may be purified de-ionized water for use in conjunction with a light source of a wavelength of 193 nm, such as an argon fluorine (ArF) laser. For other exposure wavelengths, any other appropriate immersion media may be used. Consequently, immersion lithography is a very promising approach for enhancing the resolution capability on the basis of presently available optical components and exposure wavelengths. On the other hand, providing an appropriate immersion medium in the gap between the final optical components of the imaging system and the substrate surface to be exposed may be associated with additional challenges to be dealt with. For example, minor variations or non-uniformities in the index of refraction of the immersion medium may adversely affect the quality of the exposure pattern that is imaged onto the substrate surface. For example, a change of the index of refraction of the immersion medium may be caused by a non-uniform flow of the immersion medium, by changes in the density of the immersion medium, by changes in temperature of the immersion medium and the like. Moreover, a sophisticated temperature control of the immersion medium may be required due to the fact that radiation may be absorbed within the medium, thereby resulting in a corresponding temperature variation, which in turn may affect the index of refraction of the medium. Furthermore, since the immersion medium is in contact at least with the substrate surface, which may include the radiation sensitive resist material, a particle contamination of the medium may also significantly affect the overall performance of the immersion lithography tool. For example, any such contaminating particles may adhere to the surface area, for instance other substrates or any surface portions of the immersion lithography tool, thereby contributing to degrading process conditions during the processing of a plurality of substrates. For example, in an immersion tool, typically a mechanism is implemented which may provide and confine the immersion medium within the gap between the imaging system and the substrate surface, or at least a portion thereof, while also providing the required temperature control of the immersion medium. A corresponding component may frequently be referred to as immersion hood and thus comprise a surface area that may be in contact with the immersion medium, wherein the corresponding hood surface has been identified as a major source of contamination of substrates. That is, during the processing of a plurality of substrates, increasing particles may adhere to the hood surface and may also be released into the immersion medium, which may then deposit on sensitive substrate areas of the substrate and/or in sensitive areas of the imaging system. Consequently, appropriate cleaning processes may be performed on a regular basis, thereby requiring the opening of the immersion lithography tool and exposure to ambient air, which in turn may also result in a significant risk of further contamination of components of the lithography tool. Moreover, the corresponding cleaning processes may significantly contribute to the overall down time of the lithography tool, which may thus result in increased production costs since photolithography processes may represent one of the most cost-determining process modules during the fabrication of sophisticated semiconductor devices.

In view of the situation described above, the present disclosure relates to immersion lithography systems and techniques for operating the same, while avoiding, or at least reducing the effects of, one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides immersion lithography tools and techniques for operating the same in which enhanced particle detection capabilities may be provided in order to appropriately determine the state of at least a hood surface of the lithography system. To this end, an optical detection system may be provided in combination with the lithography system to provide the capability for "inspecting" the surface state of the hood surface or determining the status thereof on the basis of optical measurement data, which may thus be obtained without exposing the interior of the lithography system to ambient air. Consequently, the optical measurement data may be obtained at any appropriate time, for instance between the processing of substrates or, in other illustrative embodiments disclosed herein, in the presence of a substrate, for instance a dedicated test substrate, a product substrate and the like, wherein, based on the optical measurement data, a cleaning process may be initiated depending on the actual state of the hood surface. Consequently, the cleaning processes may be performed "on demand" rather than on a regular basis, which conventionally may contribute to significant down times of complex immersion lithography systems.

One illustrative immersion lithography system disclosed herein comprises an imaging system having a radiation output configured to expose a defined field on a surface of a substrate with a radiation pattern. The immersion lithography system further comprises a substrate holder configured to receive the substrate and align the substrate relative to the radiation output. Moreover, an immersion hood is provided and is configured to provide an immersion medium in contact with at least a portion of the surface of the substrate, wherein the immersion hood has a hood surface that faces the substrate. Additionally, the immersion lithography system comprises an optical detection system that is configured to obtain optical measurement data at least from a portion of the hood surface.

One illustrative method disclosed herein relates to operating an immersion lithography system. The method comprises obtaining optical measurement data from a surface of an immersion hood and determining a surface state of the surface on the basis of the optical measurement data. Additionally, the method comprises controlling operation of the immersion lithography system on the basis of the surface state.

A further illustrative method disclosed herein comprises exposing a reflecting test area of a test substrate in an immersion lithography system to reflect a portion of an exposure radiation onto an immersion hood surface. The test substrate further comprises a detection area comprising a radiation sensitive material. Additionally, the method comprises determining a status of the hood surface on the basis of a latent image formed in the radiation sensitive material.

BRIEF DESCRIPTION OF THE DRAWINGS

The disclosure may be understood by reference to the following description taken in conjunction with the accompanying drawings, in which like reference numerals identify like elements, and in which:

FIG. 2b schematically illustrates a top view of the test substrate after exposure by the immersion lithography tool of FIG. 2a.

Figure 1A:
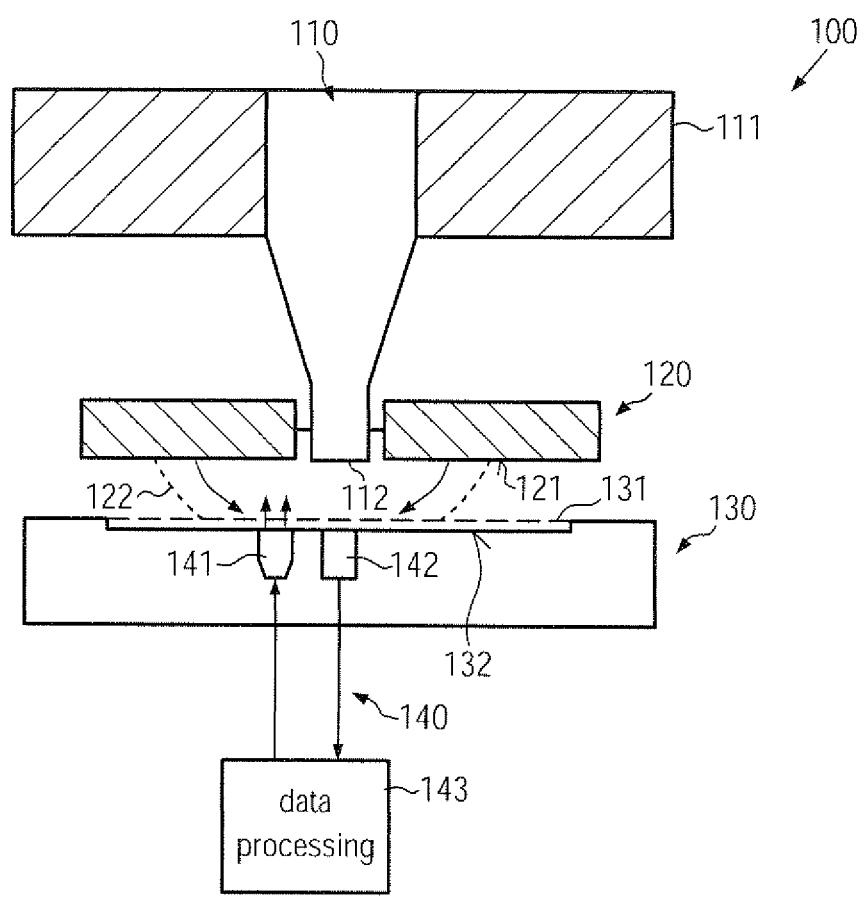
FIG. 1a schematically illustrates an immersion lithography system comprising an optical detection system, for instance in the form of an image capturing system in combination with an image processing unit, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides systems and techniques for determining the status of at least a portion of a hood surface of sophisticated immersion lithography systems by obtaining optical measurement data, such as image data, infrared spectra and the like, which may be appropriately processed and analyzed in order to determine the status of the hood surface. For this purpose, an optical detection system, such as an image capturing system, an FTIR system and the like, may be appropriately positioned within the immersion lithography tool in order to obtain "inline" optical measurement data, which may be appropriately processed without requiring exposure of the sensitive components of the lithography system to ambient air. Consequently, the status of the hood surface may be monitored with any desired time resolution so that an invalid status may be efficiently detected in order to initiate appropriate countermeasures, such as a cleaning process, an alarm and the like, in order to appropriately control the further operation of the lithography system. Moreover, the automated assessment of the contamination status of the hood surface may provide enhanced scheduling efficiency since the "rate" of the change of contamination may be determined and appropriate countermeasures may be scheduled in advance so that any planned maintenance activities associated with the immersion lithography system may be entered into a corresponding scheduling system, thereby providing an increased degree of predictability of the overall manufacturing flow within complex manufacturing environments.

In some illustrative embodiments disclosed herein the optical detection system may be provided within the substrate holder of the lithography tool, for instance in the form of a light source in combination with an image capturing device, such as a camera and the like, in order to obtain simultaneously optical measurement data of a more or less pronounced surface area of the immersion hood surface. In this case, appropriate optical measurement data may be gathered prior to or after the processing of substrates, while, in other cases, even dedicated substrates may be used, which may be transparent for the wavelength range of interest of the optical measurement detection system. In other illustrative embodiments disclosed herein, the optical detection system may be positioned separately from the substrate holder and the immersion hood, for instance on the basis of a specific stage, which may be a stationary component or which may provide a scan motion of one or more of the components of the optical detection system. For example, the optical detection system may be positioned such that the immersion hood surface may be "probed" via the reflective surface of a test substrate, thereby providing enhanced flexibility in positioning the optical detection system. At the same time, measurement data may be gathered during "operation" of the lithography tool, if desired.

In some illustrative embodiments, the surface state of the immersion hood may be estimated on the basis of chemical characteristics of any substances that may be present on the surface of the immersion hood and/or within the gap between the immersion hood surface and the substrate holder by using sensitive measurement techniques, such as Fourier transformed infrared spectroscopy, during which an interference modulated probing infrared beam may be used in order to interact at least with a surface portion of the hood surface and may be subsequently detected and appropriately analyzed. Consequently, in this manner, a change of the status may be detected by a change of the corresponding infrared spectra, which may enable an efficient determination of certain types of materials, the amount thereof and the like. It is well known that, in FTIR techniques, an interference modulated infrared beam including a plurality of wavelengths may be passed through a medium of interest or may be reflected from a surface comprising a material sample of interest, wherein the infrared wavelengths may result in the excitation of vibrations and oscillations of the corresponding molecules. Due to the interference modulation of the initial probing beam, which may also be referred to as an interferogram, the response of the material to the probing beam may be efficiently converted into an actual spectrum by Fourier transformation so that the absorbance at specific wavelengths or wavelength ranges may be detected and may be analyzed in view of the chemical characteristics of the sample material. Consequently, the FTIR technique provides an efficient tool for detecting the presence and the amount of certain species at a moderately low measurement time, since a corresponding medium may be probed with a plurality of wavelengths simultaneously within a short time interval, thereby resulting in a high signal-to-noise ratio. Consequently, the presence of unwanted species on the surface of the immersion unit and, depending on the configuration of the detection system, within the gap between the immersion hood and the substrate holder may be efficiently detected and used for evaluating the status of the lithography tool.

In still other illustrative embodiments disclosed herein, dedicated test substrates may be used as a "detection system" in that light may be directed to the hood surface and may finally be absorbed in a radiation sensitive material of the test substrate. For example, in some illustrative embodiments, the imaging system of the lithography tool may itself be used as an efficient light source, which may expose one or more specifically designed portions on the dedicated test substrate in order to efficiently irradiate the surface portion of the immersion hood, which may in turn result in reflected light absorbed in the radiation sensitive material. Consequently, after exposure of the dedicated test substrate, an efficient estimation of the status of the hood surface may be accomplished on the basis of the latent image formed in the radiation sensitive material of the test substrate.

FIG. 1a schematically illustrates an immersion lithography system 100 comprising a substrate holder 130 that is appropriately configured for receiving a substrate 131, as indicated by the dashed line. For this purpose, the substrate holder 130 may comprise a substrate receiving surface 132, for instance in the form of a vacuum chuck and the like. The substrate holder 130 may further be configured to provide any sources for moving or rotating the substrate receiving surface 132 as may be required for appropriately aligning the substrate 131 with respect to an imaging system 110. The imaging system 110 may comprise a plurality of optical components, such as lenses, mirrors and the like, in order to image a pattern of a photomask, such as a reticle, onto a surface of the substrate 131 during operation of the system 100. For convenience, any such complex optical components are not shown in FIG. 1a. Furthermore, the imaging system 110 may comprise an output 112, which may, for instance, be represented by a final lens component in order to provide a radiation pattern corresponding to the lithography mask in order to expose a portion of the substrate 131 with the radiation pattern. It should be appreciated that the imaging system 110 may be provided in the form of a projection system in which the pattern of the lithography mask may be reduced in size by any appropriate scaling factor. Moreover, the imaging system 110 may be connected to any appropriate structure 111, which may provide the mechanical stability and the like as is well known in the art. Traditionally, the system 100 may comprise an immersion hood 120 which may be understood as any appropriate system for providing an immersion medium 122, indicated as dashed lines, and confining the immersion medium 122, for instance, so as to contact a specific area on the substrate 131, wherein it should be appreciated that, typically, a scanning movement of the substrate 131 may be performed during operation of the system 100. The immersion hood 120 may comprise any appropriate resources, such as fluid lines and the like, in order to provide the immersion medium 122, possibly in combination with additional fluids in order to appropriately adjust characteristics and the size and shape of the immersion medium 122. For convenience, any such mechanisms and resources are not shown in FIG. 1a since these components are readily known in the art. Furthermore, as previously explained, the immersion hood 120 may comprise a surface 121, which may be in contact with the immersion medium 122 and which may suffer from particle contamination and which may thus also represent a source contamination for other tool components and for the surface of the substrate 131. Moreover, the lithography system 100 may comprise an optical detection system 140 configured to obtain optical measurement data from the surface 121. In the embodiment shown, the detection system 140 may comprise a radiation source 141, a radiation detector 142 and a data processing unit 143. The radiation source 141 and the detector 142 may be formed within the substrate holder 130 and may, in the embodiment shown, be positioned so as to connect to a surface area of the substrate receiving surface 132. Consequently, upon moving the substrate 130, the detection system 140 may obtain measurement data from any surface portion of the surface 121. In other illustrative embodiments (not shown), the radiation source 141 and the detector 142 may be positioned at any other location or site of the substrate receiving surface 132. The radiation source 141 may provide any appropriate optical beam, such as ultraviolet radiation, which may be reflected at least from a portion of the surface 121 and which may finally be detected by the detector 142. For example, in one illustrative embodiment, the detector 142 may be provided in the form of an image capturing device such as a camera, such as a CCD camera and the like, in order to provide digital image data to the data processing unit 143. In this case, the detector 142 may further comprise any optical components required for obtaining optical information from an extended area of the surface 121. Consequently, an extended portion of the surface 121 may be simultaneously probed and may then be analyzed on the basis of an appropriate image processing function that may be implemented in the data processing unit 143. For example, the image processing may include image recognition systems, which are well known in the art, in which specific characteristics of the image data may be identified and may be correlated with one or more characteristics of the surface 121. For this purpose, appropriate reference data may be obtained, for instance an image of the surface 121 in a substantially non-contaminated state and the like, which may then be used for evaluating a corresponding image data obtained after a certain operating time of the system 100. For this purpose, a plurality of well-established image processing tools is available and may be used in the data processing unit 143.

In other illustrative embodiments, the radiation source 141 may be configured to provide an interference modulated infrared beam, which may be reflected from the surface 121 and which may interact with any substances formed thereon, at least in the surface portion probed by the corresponding interference modulated beam. Consequently, the detector 142 may receive the interference modulated infrared beam, which may then be processed in the unit 143 to obtain optical measurement spectra. As previously explained, the interference modulation provides the possibility to efficiently use a plurality of wavelengths simultaneously, which may then be appropriately transformed into spectra on the basis of Fourier transformation, wherein these spectra may contain information with respect to substances present on the surface 121. Due to the enhanced signal-to-noise ratio of the FTIR technique, the type of molecular species present on the surface 121, as well as the amount thereof, may be detected and may be used as an evaluation of the surface status of the immersion hood 120. Also, in this case, appropriate reference data may be obtained, for instance, by probing the surface 121 in a substantially non-contaminated state or by using any previously obtained measurement data as reference for any subsequently obtained measurement spectra, thereby also enabling a monitoring of a change of the contamination state.

The immersion lithography system 100 as shown in FIG. 1a may be operated on the basis of well-established process recipes, wherein, for instance, after processing a certain number of substrates, or at any other time, the detection system 140 may be activated, for instance, prior to processing a next substrate in order to probe at least a portion of the surface 121 to obtain a corresponding estimation of the surface status. For this purpose, in some illustrative embodiments, a desired scan operation of the substrate holder 130 may be initiated in order to "cover" a desired surface area of the immersion hood 120, depending on the configuration and the capabilities of the radiation source 141 and the detector 142. For instance, by using an appropriate imaging capturing device, a moderately large area of the surface 121 may be simultaneously probed. In other cases, a restricted area of the surface 121 may be used as a monitor that may represent the status of the entire surface 121. Consequently, after obtaining the optical measurement data, for instance in the form of image data, spectra and the like, an appropriate data processing may be performed, for instance a comparison with corresponding reference data, and the status of the surface 121 may be estimated on the basis of this comparison. For example, if a quantitative metric of the status is outside of a well-defined range, for instance, if a predefined number of particles is exceeded, if a predefined size of individual particles is exceeded and the like, corresponding countermeasures may be taken. For instance, the system 140 may trigger a cleaning process or may at least provide an indication of the current status of the surface 121, which may then be used for further activities. For example, as previously indicated, a more or less "continuous" monitoring of the status of the surface 121 may enable a corresponding prediction of a point in time of a maintenance activity to be performed on the system 100, which may appropriately be entered into a corresponding scheduling regime.

Figure 1B:
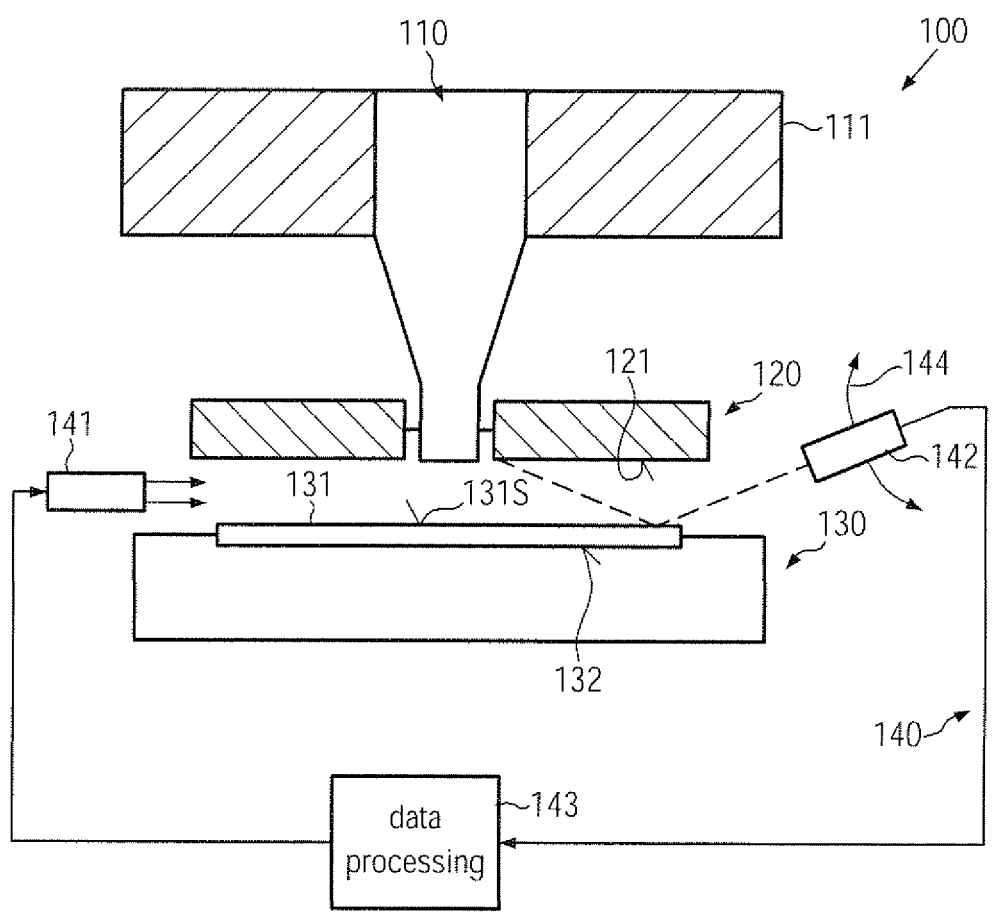
FIG. 1b schematically illustrates the immersion lithography system according to further illustrative embodiments in which an optical detection system, such as an image capturing system, a Fourier transformed infrared spectroscopy system (FTIR), or any other optical system, may be appropriately positioned outside of a substrate holder so as to "probe" at least a portion of the hood surface.

FIG. 1b schematically illustrates the lithography system 100 according to further illustrative embodiments. As illustrated, the optical detection system 140 may be configured such that one or both of the components 141, 142 may be positioned outside of the substrate holder 130. In the embodiment shown, the detector 142, for instance provided in the form of an infrared detector, an image capturing device and the like, may be positioned such that the surface 121 may be "viewed" by a reflection on a surface 131S of a substrate 131 positioned on the substrate holder 130. Moreover, the radiation source 141 may be appropriately positioned in order to illuminate the surface 121 on the basis of any appropriate radiation. For example, FTIR techniques may be used in combination with the system 140, or in other cases a digital camera may be used in order to obtain digital image data, as discussed above. Furthermore, in the embodiment shown, a scan system 144 may be provided so as to enable a change of position of at least one component of the detection system 140. In the embodiment shown, at least the detector 142 may be movable so as to appropriately adapt its position to obtain measurement data from different surface areas of the immersion hood 120. In other illustrative embodiments, the detector 142 may be appropriately positioned so as to also obtain optical measurement data from the space between the surface 121 and the substrate 131, for instance when at least partially being filled with the immersion medium, or in the absence of the immersion medium and the like.

In some illustrative embodiments, the system 100 may be operated on the basis of a specifically designed test substrate, wherein the surface 131S may provide a high degree of reflectivity for radiation emitted by the radiation source 141. For example, when using UV radiation, the substrate 131 may be used as a silicon substrate or may receive one or more additional material layers for enhancing the overall reflectivity for the incident radiation. For example, the detector 142 when provided as an image capturing device may obtain one or more digital images from the surface 121 via the surface 131S, which may act as a mirror. In other illustrative embodiments, an estimation of surface status of the immersion hood 120 may be obtained without providing the substrate 131, for instance by applying FTIR techniques, in which at least a portion of the incident probing beam may interact with the surface 121 and thus with any sample materials formed thereon, as is previously discussed. Furthermore, in this configuration, the substrate receiving surface 132 may also be estimated with respect to surface contamination, for instance by appropriately positioning the radiation source 141 and the detector 142. In still other illustrative embodiments, the detection system 140 may be operated while processing the substrate 131 so as to obtain optical measurement data, which may also obtain information with respect to the immersion medium, the surface 121 and the surface 131S. It should be appreciated that, in this case, it may be advantageous to provide a dedicated test surface 131S in order to enhance signal-to-noise ratio with respect to material samples formed on the surface 121, and possibly within the immersion medium so that the surface 131S may act as a substantially neutral mirror surface. In other cases, the substrate 131 may represent a product substrate having formed thereon radiation sensitive material.

Consequently, the configuration of the detection system 140 of the system 100 of FIG. 1b may provide a high degree of flexibility in obtaining optical measurement data, wherein even the dynamic behavior in the gap between the surface 121 and the substrate 131, possibly in the presence of the immersion medium, may be evaluated.

Figure 2A:
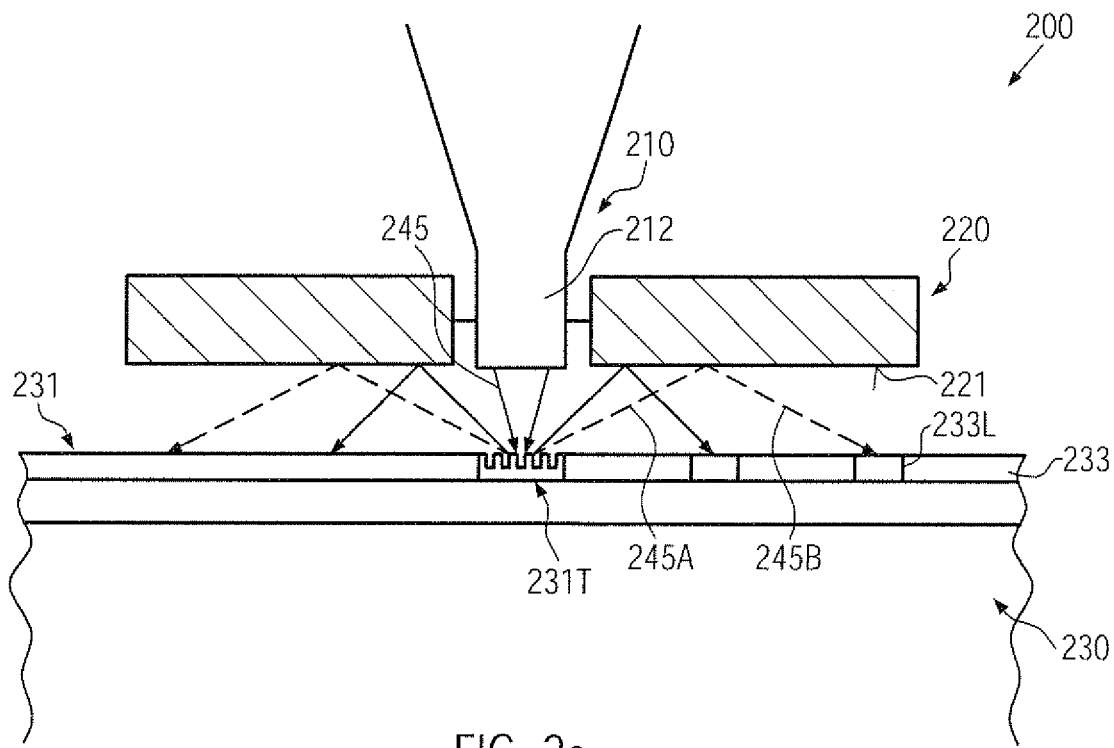
FIG. 2a schematically illustrates a portion of the immersion lithography system when processing a test substrate for obtaining optical measurement data from a hood surface, according to still further illustrative embodiments.

FIG. 2a schematically illustrates an immersion lithography system 200 comprising a substrate holder 230, an immersion hood 220 and an imaging system 210. With respect to these components, the same criteria may apply as previously explained with reference to the lithography system 100. Furthermore, in the operating phase shown in FIG. 2a, a specific test substrate 231 may be positioned on the substrate holder 230. The test substrate 231 may comprise a portion 231T that may provide a desired reflectivity. Moreover, the test substrate 231 may comprise a material layer 233 comprising a radiation sensitive material, such as a photoresist and the like. The test substrate 231 may be prepared on the basis of any well-established manufacturing techniques, for instance by forming appropriate structure in the area 231T by using lithography and patterning techniques, as are well established in the art. For example, the area 231T may comprise appropriately designed gratings or any other pattern that may provide the desired reflectivity for a given wavelength or wavelength range. Based on the structure 231T, the material layer 233 may be formed, for instance, by spin-coating a polymer material or resist material having the desired sensitivity to the exposure wavelength. If desired, material above the structure 231T may be removed, for instance, by appropriate etch techniques, while, in other cases, if required, a mild chemical mechanical polishing (CMP) process may be performed. It should be appreciated that the area 231T may have a very large size compared to critical dimensions of any features contained therein so that, for instance, a selective removal of material of the layer 233 from the area 231T may be less critical and may be performed on the basis of any spatially selective process, wherein interaction with material in close proximity to the area 231T may not negatively affect the function of the test substrate 231.

Upon operating the system 200, the substrate 231 may be positioned on the substrate holder 230 and may be aligned with respect to the imaging system 210, which may comprise a radiation output 212, as previously explained with reference to the system 100. Thereafter, the area 231T may be exposed by an appropriate radiation 245, which may be provided by any appropriate radiation source (not shown), such as a UV radiation source and the like. In the embodiment shown, the radiation 245 may be provided from the output 212, so that the imaging system and the corresponding radiation source of the lithography tool 200 may be used as a source for providing a probing optical beam for probing the surface 221. For instance, the lithography tool 200 may be operated without a photo mask and an appropriate exposure dose may be adjusted in order to obtain radiation 245 with a desired intensity, wherein the wavelength may correspond to the exposure wavelength of the tool 200. Upon interacting with the area 231T, a significant portion of the incoming radiation 245 may be reflected and may be directed to the surface 221 as a reflected portion 245A. After reaction with the surface 221, for instance after being scattered by any particles formed thereon, a beam 245B may be directed to the substrate 231 and may be absorbed in the layer 233, thereby creating a latent image 233L in the material 233. Consequently, after exposure of the substrate 231, i.e., after exposing the area 231T with beam 245 and receiving the reflected and scattered beams 245B, the substrate 231 may be subjected to further analysis, such as any appropriate inspection techniques, which may be available in a production environment for forming microstructure devices.

It should be appreciated that the lithography tool 200 may, in some illustrative embodiments, be operated without providing the immersion medium during producing the beam 245 when the presence of the immersion medium is considered inappropriate for obtaining the desired latent image 233L. In other illustrative embodiments, a substantially "regular" exposure process may be performed on the specified area 231T, for instance, using the immersion medium (not shown), if desired. It should further be appreciated that, if considered appropriate, the exposure may be performed on the basis of a specifically designed test reticle including a specific pattern, which may thus be projected on the surface 221 and may also be present in the latent image 233L, which may, for instance, facilitate the subsequent analysis of the latent image 233L.

Figure 2B:
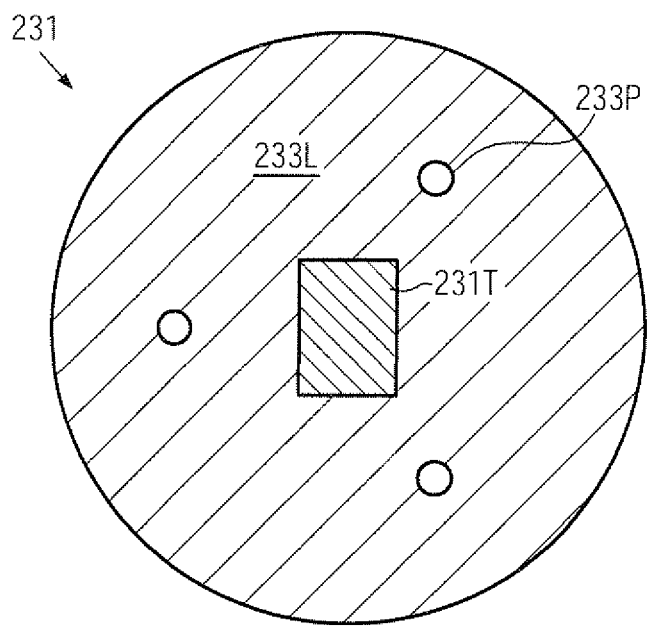

FIG. 2b schematically illustrates a top view of the test substrate 231 comprising the test area 231T and the latent image 233L, or any modified version thereof. That is, after exposure in the tool 200, as described with reference to FIG. 2a, the latent image 233L may be further processed, for instance a development process may be performed and the like, thereby obtaining an "image" of at least a portion of the surface 221 (FIG. 2a), depending on the optical characteristics of the test area 231T, the exposure wavelength, a possible light pattern contained therein and the like. For example, after processing the latent image 233L, corresponding areas 233P may be identified therein, for instance by optical inspection and the like, which may represent an indication of the status of the surface 221, or at least a portion thereof. Consequently, based on the knowledge of the characteristics of the region 231T and the radiation 245 (FIG. 2a) and possibly on the basis of a knowledge of a corresponding test pattern of a test reticle, quantitative values, for instance with respect to particle size, position, particle count and the like, may be obtained on the basis of the latent image 233L. Consequently, an efficient evaluation of the status of the surface 221 may be accomplished by using the test substrate 231 in combination with an appropriate radiation source, wherein, in some illustrative embodiments, even the lithography system 200 itself may be used as a radiation source.

As a result, the present disclosure provides lithography systems and techniques for operating the same in which the status of at least a portion of the immersion hood surface may be monitored with respect to particles and other contamination by using optical detection systems, such as an image capturing system, an FTIR system and the like. Hence, inline measurement data may be obtained without requiring exposing the interior of the lithography system to ambient air. Furthermore, upon determining the status of the hood surface, appropriate actions may be initiated, such as a cleaning process, while, in other cases, more or less continuous monitoring of the contamination state may be accomplished. The surface state may be characterized by an appropriate metric in order to indicate an invalid state of the immersion hood. Moreover, the metric may also be used for scheduling the overall process flow in a complex manufacturing environment, for instance, with respect to planned maintenance events of the immersion lithography tool. In still other illustrative embodiments, efficient estimation may be accomplished on the basis of dedicated test substrates, possibly in combination with a tool internal imaging system.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An immersion lithography system, comprising:
   an imaging system having a radiation output configured to expose a defined field on a surface of a substrate with a radiation pattern;
   a substrate holder configured to receive said substrate and align said substrate relative to said radiation output;
   an immersion hood configured to provide an immersion medium in contact with at least a portion of said surface, said immersion hood having a hood surface facing said substrate; and
   an optical detection system configured to obtain optical measurement data at least from a portion of said hood surface, wherein said optical detection system is positioned to obtain said optical measurement data by reflection from said surface of said substrate.

2. The immersion lithography system of claim 1, wherein said optical detection system is positioned in said substrate holder.

3. The immersion lithography system of claim 1, wherein said optical detection system is positioned so as to obtain said optical measurement data when said substrate is positioned on said substrate holder.

4. The immersion lithography system of claim 1, wherein said optical detection system comprises an image capturing unit.

5. The immersion lithography system of claim 4, further comprising an image processing system coupled to said image capturing unit.

6. The immersion lithography system of claim 4, wherein said image capturing unit is formed in a substrate receiving surface of said substrate holder.

7. The immersion lithography system of claim 1, further comprising a scan system coupled to said optical detection system.

8. The immersion lithography system of claim 7, wherein said scan system is configured to position said optical detection system so as to obtain said optical measurement data during operation of said immersion lithography system.

9. The immersion lithography system of claim 1, wherein said optical detection system comprises a light source configured to provide an interference modulated probing infrared beam and a light detector configured to receive a portion of said interference modulated probing infrared beam after interaction with said at least a portion of said hood surface.

10. A method of operating an immersion lithography system, the method comprising:
    obtaining optical measurement data from a surface of an immersion hood, wherein obtaining said optical measurement data comprises obtaining an optical signal from said surface via reflection of said optical signal on a substrate surface positioned on a substrate receiving surface of a substrate holder of said immersion lithography system;
    determining a surface state of said surface on the basis of said optical measurement data; and
    controlling operation of said immersion lithography system on the basis of said surface state.

11. The method of claim 10, wherein obtaining said optical measurement data comprises obtaining an image data of at least a portion of said surface.

12. The method of claim 10, wherein obtaining said optical measurement data comprises providing an optical detection system in a substrate receiving surface of a substrate holder and gathering data in the absence of a substrate.

13. The method of claim 10, further comprising initiating a cleaning process of said surface when said surface state is outside a predefined allowable range.

14. The method of claim 10, wherein obtaining said optical measurement data comprises exposing said surface to an interference modulated infrared beam, detecting a portion of said interference modulated infrared beam and performing a Fourier transformation so as to obtain a spectrum.

15. A method, comprising:
    exposing a reflecting test area of a test substrate in an immersion lithography system so as to reflect a portion of an exposure radiation onto an immersion hood surface, said test substrate further comprising a detection area comprising a radiation sensitive material; and
    determining a status of said hood surface on the basis of a latent image formed in said radiation sensitive material.

16. The method of claim 15, wherein exposing said reflecting test area of the test substrate comprises providing an immersion fluid at least on said test area.

17. The method of claim 15, wherein determining a status of said hood surface comprises determining at least one of a size, a number and a position of particles on the basis of said latent image.

18. The method of claim 15, further comprising performing a cleaning process on said hood surface when said determined status of said hood surface is outside a predefined range.

19. An immersion lithography system, comprising:
an imaging system having a radiation output configured to expose a reflecting test area of a test substrate with a radiation pattern, said test wafer including a detection area comprising a radiation sensitive material;
a substrate holder configured to receive said substrate and align said substrate relative to said radiation output;
an immersion hood configured to provide an immersion medium in contact with at least a portion of said surface, said immersion hood having a hood surface facing said substrate on which a portion of an exposure radiation is reflected to expose said radiation sensitive material; and
a detection system configured to determine a status of said hood surface on the basis of a latent image formed in said radiation sensitive material.

20. The system of claim 19, wherein an immersion fluid is present at least on said test area.

21. The system of claim 19, the detection system is operable to determine at least one of a size, a number and a position of particles on the basis of said latent image.

* * * * *